(12) United States Patent
Park et al.

(10) Patent No.: US 11,002,797 B2
(45) Date of Patent: May 11, 2021

(54) FAULT DIAGNOSIS CIRCUIT FOR BATTERY MANAGEMENT SYSTEM

(71) Applicant: HYUNDAI AUTRON CO., LTD., Seoul (KR)

(72) Inventors: Jae-Seong Park, Ansan-Si (KR); Seulkirom Kim, Seoul (KR); Jae-Min Park, Yongin-Si (KR); Yeong-Geun Yeo, Seoul (KR); Sang-Ho Lee, Suwon-Si (KR); Jong-Won Choi, Suwon-Si (KR)

(73) Assignee: HYUNDAI MOBIS CO., LTD., Seoul (KR)

( * ) Notice: Subject to any disclaimer, the term of this patent is extended or adjusted under 35 U.S.C. 154(b) by 136 days.

(21) Appl. No.: 16/456,497

(22) Filed: Jun. 28, 2019

(65) Prior Publication Data

US 2020/0011916 A1 Jan. 9, 2020

(51) Int. Cl.
*G01R 31/02* (2006.01)
*G01R 31/50* (2020.01)
(Continued)

(52) U.S. Cl.
CPC ........ *G01R 31/50* (2020.01); *H01M 10/4285* (2013.01); *H03M 1/12* (2013.01); *H03M 1/66* (2013.01); *G01R 31/382* (2019.01)

(58) Field of Classification Search
CPC .... G01R 31/50; G01R 31/382; G01R 31/389; G01R 31/2836; H03M 1/66; H03M 1/12; H03M 1/1076; H01M 10/4285; H01M 10/425; H01M 2010/4271; Y02E 60/10; Y02T 10/70; B60L 58/10
(Continued)

(56) References Cited

U.S. PATENT DOCUMENTS

2002/0121901 A1 * 9/2002 Hoffman .............. G01R 31/389
                                                        324/426
2004/0263119 A1 * 12/2004 Meyer .................. H02J 7/0036
                                                        320/116

(Continued)

FOREIGN PATENT DOCUMENTS

KR     10-0253369 B1    4/2000
KR     10-0471087 B1    3/2005
(Continued)

*Primary Examiner* — Tung X Nguyen
*Assistant Examiner* — Robert P Alejnikov, Jr.
(74) *Attorney, Agent, or Firm* — Morgan, Lewis & Bockius LLP (57) ABSTRACT

The fault diagnosis circuit includes a first line including a first resistor, having one end connected to the positive (+) terminal of a battery, and having the other end connected to a first input unit of an analog to digital converter (ADC); a second line including a second resistor, having one end connected to the positive (+) terminal of the battery, and having the other end connected to a first input unit of a comparator; and a third line including a third resistor, having one end connected to the negative (−) terminal of the battery, having a first other end connected to a second input unit of the ADC, and having a second other end connected to a second input unit of the comparator. A fault in a battery management system can be efficiently diagnosed using a smaller number of elements.

3 Claims, 5 Drawing Sheets

100

(51) Int. Cl.
   *H03M 1/66*    (2006.01)
   *H03M 1/12*    (2006.01)
   *H01M 10/42*   (2006.01)
   *G01R 31/382*  (2019.01)

(58) Field of Classification Search
   USPC .......................................................... 324/522
   See application file for complete search history.

(56) References Cited

U.S. PATENT DOCUMENTS

2013/0278059 A1* 10/2013 Liu .................... G01R 19/10
                                                    307/31
2017/0299658 A1* 10/2017 Kozuka ................ H02J 7/0021
2017/0328940 A1* 11/2017 Choi ...................... G01R 27/18

FOREIGN PATENT DOCUMENTS

| KR | 10-1610908 81  | 4/2016 |
| KR | 10-1628858 B1  | 6/2016 |
| KR | 10-1641435 B1  | 7/2016 |
| KR | 10-1744713 B1  | 6/2017 |

* cited by examiner

FIG. 5

FAULT DIAGNOSIS CIRCUIT FOR BATTERY MANAGEMENT SYSTEM

CROSS REFERENCE TO RELATED APPLICATION

This application is based on and claims priority under 35 U.S.C. 119 to Korean Patent Application No. 10-2018-0077272, filed on Jul. 3, 2018, in the Korean Intellectual Property Office, the disclosures of which is herein incorporated by reference in their entireties.

BACKGROUND OF THE INVENTION

1. Technical Field

The present invention relates to the fault diagnosis circuit of a battery management system and, more particularly, to the fault diagnosis circuit of a battery management system having reinforced safety specifications, which diagnoses a fault in battery management system by connecting a voltage measurement device and a comparator to two paths.

2. Description of the Related Art

A battery management system (BMS) is a system for efficiently managing the charging or discharging of each battery cell by measuring a voltage of each battery cell of a battery and a voltage and current of the entire battery.

There is a need to diagnose a fault in the BMS because there is a problem in that there is no separate device capable of properly handling the overcharging or overdischarging situation of a battery when the BMS has a fault.

In a conventional technology, a method of outputting a signal indicating whether abnormality has occurred in the BMS is used as a method of diagnosing a fault in the BMS. A signal indicating whether abnormality has occurred in a battery may not be output although abnormality and/or a fault has occurred in the battery. Furthermore, there is a problem in that although a battery is a normal state, a signal indicating that abnormality has occurred in the battery is output.

As the safety specifications of the BMS are reinforced, there is a need for the fault diagnosis circuit of the BMS having reinforced safety specifications.

The present invention has been intended to solve such conventional problems and is related to the fault diagnosis circuit of a BMS having reinforced safety specifications.

PRIOR ART DOCUMENT

Patent Document (Patent Document 1) Korean Patent No. 10-1641435 (Jul. 14, 2016)

SUMMARY OF THE INVENTION

An embodiment of the present invention provides the fault diagnosis circuit of a battery management system for efficiently diagnosing a fault in the battery management system using a smaller number of elements.

An embodiment of the present invention provides the fault diagnosis circuit of a battery management system, which complies with reinforced safety specifications and reduces a production cost.

Technical objects of the present invention are not limited to the above-described technical objects, and other technical objects not described above may be evidently understood by a person having ordinary skill in the art from the following description.

A fault diagnosis circuit of a battery management system according to an embodiment of the present invention may include a first line including a first resistor, having one end connected to the positive (+) terminal of a battery, and having the other end connected to a first input unit of an analog to digital converter (ADC); a second line including a second resistor, having one end connected to the positive (+) terminal of the battery, and having the other end connected to a first input unit of a comparator; and a third line including a third resistor, having one end connected to the negative (−) terminal of the battery, having a first other end connected to a second input unit of the ADC, and having a second other end connected to a second input unit of the comparator.

According to an embodiment, the fault diagnosis circuit further includes a switch for diagnosing whether the third has a fault. One end of the switch may be connected to the other end of the second line. The other end of the switch may be connected to the second other end of the third line.

According to an embodiment, when the switch is turned on, whether the third resistor has a fault may be diagnosed through a current Ib flowing into the third line via the second line and the switch.

According to an embodiment, the reference voltage of the comparator may include at least one of a first reference voltage when the switch is turned off or a second reference voltage when the switch is turned on.

According to an embodiment, the first reference voltage may include an output value calculated by inputting an output value of the ADC to a digital to analog converter (DAC).

According to an embodiment, the second reference voltage may include a value obtained by subtracting, from the first reference voltage, the product of a value of the third resistor and a current Ib flowing into the third line via the second line and the switch when the switch is turned on.

According to an embodiment, when the switch is turned on, the voltage validity of the ADC may be verified through a comparison between the second reference voltage of the comparator and a voltage measured through the first input unit and second input unit of the comparator.

According to an embodiment, when the switch is turned off, the voltage validity of the ADC may be verified through a comparison between the first reference voltage of the comparator and a voltage measured through the first input unit and second input unit of the comparator.

According to an embodiment, the reference voltage of the ADC may be different from the reference voltage of the comparator.

According to an embodiment, whether the first resistor has a fault may be diagnosed through the comparator, and whether the second resistor has a fault may be diagnosed through the ADC.

DESCRIPTION OF REFERENCE NUMERALS

100: fault diagnosis circuit 5: battery
10: first resistor 20: second resistor
30: third resistor 40: ADC
42: first input unit of ADC
44: second input unit of ADC
52: first input unit of comparator
54: second input unit of comparator

DETAILED DESCRIPTION

Hereinafter, embodiments of the present invention are described in detail with reference to the accompanying drawings. The merits and characteristics of the disclosure and a method for achieving the merits and characteristics will become more apparent from the embodiments described in detail in conjunction with the accompanying drawings. However, the disclosure is not limited to the disclosed embodiments, but may be implemented in various different ways. The embodiments are provided to only complete the disclosure and to allow those skilled in the art to fully understand the category of the disclosure. The disclosure is defined by the category of the claims. The same reference numerals will be used to refer to the same or similar elements throughout the drawings.

A term "battery 5" used in this specification may be considered to be a battery used as a power source for an electric vehicle, more specifically, a set of a plurality of battery cells that are connected in series or in parallel. All terms (including technical and scientific terms) used in this specification may be used as a meaning which can be understood by a person having ordinary knowledge in the field to which the present invention pertains unless they are defined otherwise. Furthermore, all terms (including technological and scientific terms) used in the specification, unless defined otherwise, will be used as meanings which can be understood by a person having ordinary knowledge in the art to which the present invention pertains in common. Furthermore, terms used and defined in common dictionaries should not be construed as having ideal or excessively formal meanings unless specifically defined otherwise.

A term, such as "comprise (or include)" and/or "comprising (or including)" used in the specification, do not exclude the existence or addition of one or more elements, steps, operations and/or devices in addition to the described elements, steps, operations and/or devices.

Furthermore, it is based on the premise that reference numerals in the drawings and element symbols may be combined and written for convenience sake.

Hereinafter, embodiments of the present invention are described more specifically with reference to the accompanying drawings.

Figure 1:
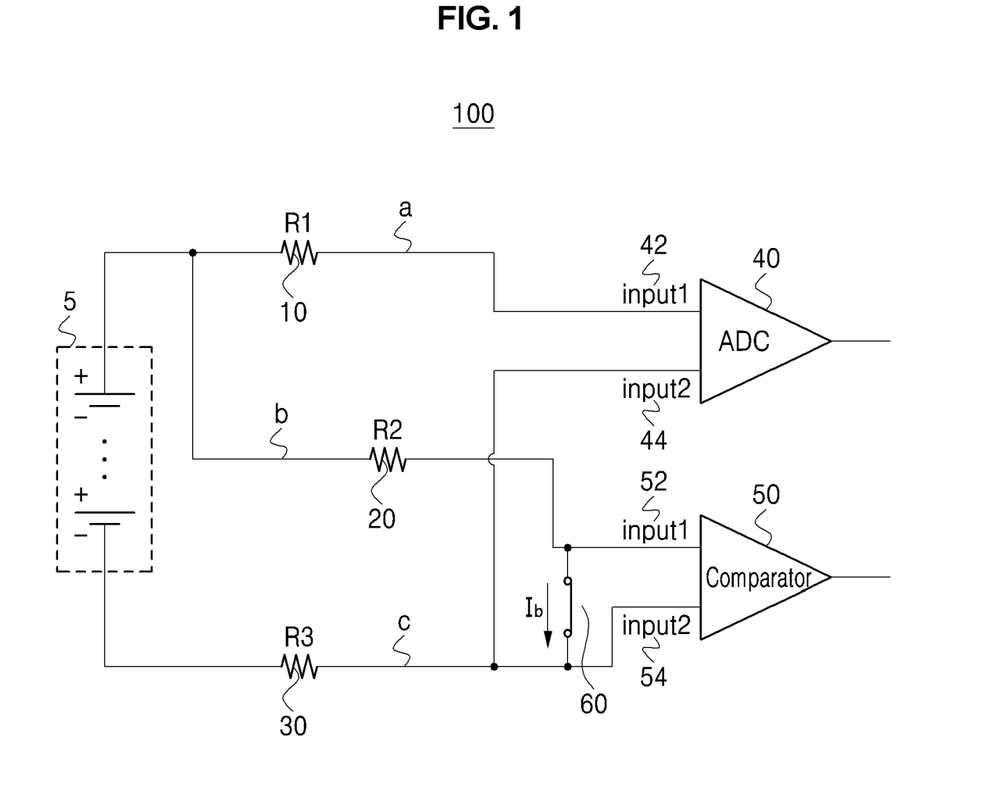
FIG. 1 illustrates the configuration of a fault diagnosis circuit of a battery management system according to an embodiment of the present invention.

FIG. 1 illustrates the configuration of a fault diagnosis circuit of a battery management system (BMS) according to an embodiment of the present invention.

The fault diagnosis circuit 100 of the BMS according to an embodiment includes a first line "a", a second line "b", a third line "c", an analog to digital converter (ADC) 40, a comparator 50 and a switch 60.

The first line "a" includes a first resistor 10, and has one end connected to the positive (+) terminal of a battery 5 and the other end connected to the first input unit 42 of the ADC 40.

The second line "b" includes a second resistor 20, and has one end connected to the positive (+) terminal of the battery 5 and the other end connected to the first input unit 52 of the comparator 50.

The third line "c" includes a third resistor 30, and has one end connected to the negative (−) terminal of the battery 5 and a first other end connected to the second input unit 44 of the ADC 40 and a second other end connected to the second input unit 54 of the comparator 50.

In this case, the third resistor 30 and the first resistor 10 may have the same resistance value, but the present invention is not essentially limited thereto.

One end of the switch 60 is connected to the other end of the second line "b". The other end of the switch 60 is connected to the second other end of the third line "c."

A semiconductor switching element, such as a field effect transistor (FET), a metal oxide semiconductor FET (MOSFET), an insulated gate bipolar mode transistor (IGBT) or a power rectifier diode, a thyristor, a gate turn-off (GTO) thyristor, a TRIAC, a silicon controlled rectifier (SCR), or an integrated circuit (IC) circuit may be used as the switch 60, but the present invention is not essentially limited thereto.

The first input unit 52 of the comparator 50 is connected to the other end of the second line "b", and the second input unit 54 is connected to the second other end of the third line "c."

The comparator 50 may enable an abnormality generation signal to be generated when a reference voltage is not equal to a voltage applied through the first input unit 52 and the second input unit 54.

In this case, the reference voltage is a voltage, that is, a reference for a comparison with a voltage applied to the comparator 50.

However, since a measurement error may occur, the comparator 50 may set a difference between a reference value into which the error has been taken into consideration, that is, the reference voltage, and a voltage applied through the first input unit 52 and the second input unit 54 as a given value.

The comparator 50 may enable an abnormality generation signal to be generated only when a difference between a reference voltage and a voltage applied through the first input unit 52 and the second input unit 54 is a reference value or more.

The comparator 50 may have different reference voltages depending on an operation of the switch 60.

More specifically, a reference voltage of the comparator 50 may be at least one of a first reference voltage when the switch 60 is turned off or a second reference voltage when the switch 60 is turned on.

In this case, the first reference voltage may be an output value calculated by inputting the output value of the ADC 40 to a digital to analog converter (DAC). The DAC may sample an input voltage and output an approximate analog voltage through a continuous comparison process.

The second reference voltage may be a value obtained by subtracting the product of a value of the third resistor 30 and a current Ib flowing into the third line "c" via the second line "b" and the switch 60 when the switch 60 is turned on from the first reference voltage.

The first input unit 42 of the ADC 40 is connected to the other end of the first line "a." The second input unit 44 is connected to the first other end of the third line "c."

The ADC 40 compares a voltage, measured through the first input unit 42 and the second input unit 44, with a reference voltage, and converts a resulting voltage into a digital value. In order to obtain an accurate voltage value through the first input unit 42 and the second input unit 44, the ADC 40 may have high precision and high resolution (in this case, the resolution means the number of voltage levels that may be identified by the ADC 40), but the present invention is not essentially limited thereto.

The reference voltage of the ADC 40 may be different from the reference voltage of the comparator 50. The independence of the ADC 40 and the comparator 50 may be guaranteed because the reference voltages of the ADC 40 and the comparator 50 are different as described above.

The voltage validity of the ADC 40 may be verified through a comparison between a measured voltage and a reference voltage of the comparator 50 differently set depending on an operation of the switch 60.

More specifically, when the switch 60 is turned on, the voltage validity of the ADC 40 may be verified through a comparison between a second reference voltage of the comparator 50 and a voltage measured through the first input unit 52 and second input unit 54 of the comparator 50.

When the switch 60 is turned off, the voltage validity of the ADC 40 may be verified through a comparison between a first reference voltage of the comparator 50 and a voltage measured through the first input unit 52 and second input unit 54 of the comparator 50.

As described above, the voltage validity of the ADC 40 may be an index for determining whether the first line "a", that is, the first resistor 10, has a fault. Furthermore, whether the ADC 40 has a fault may be determined based on the index.

Although not shown specifically, the output side of the ADC 40 and the comparator 50 may be electrically connected to a fault diagnosis unit (not shown).

The fault diagnosis unit (not shown) is electrically connected to the output of the ADC 40 and the output side of the comparator 50, and may receive a converted digital value from the ADC 40 or receive an abnormality generation signal from the comparator 50.

The fault diagnosis unit (not shown) may diagnose that the BMS has a fault through the fault diagnosis circuit 100, and may notify a user of the fault.

The configuration of the fault diagnosis circuit 100 of a BMS according to an embodiment of the present invention has been described so far. A production cost can be reduced and safety specifications of a battery management safety system can be reinforced because a fault on different lines is diagnosed through a single ADC 40 and the comparator 50.

An operation of the fault diagnosis circuit 100 according to an embodiment of the present invention is described with reference to FIGS. 2 to 4. More specifically, an operation of the fault diagnosis circuit 100 is described when different resistors have a fault.

Figure 2:
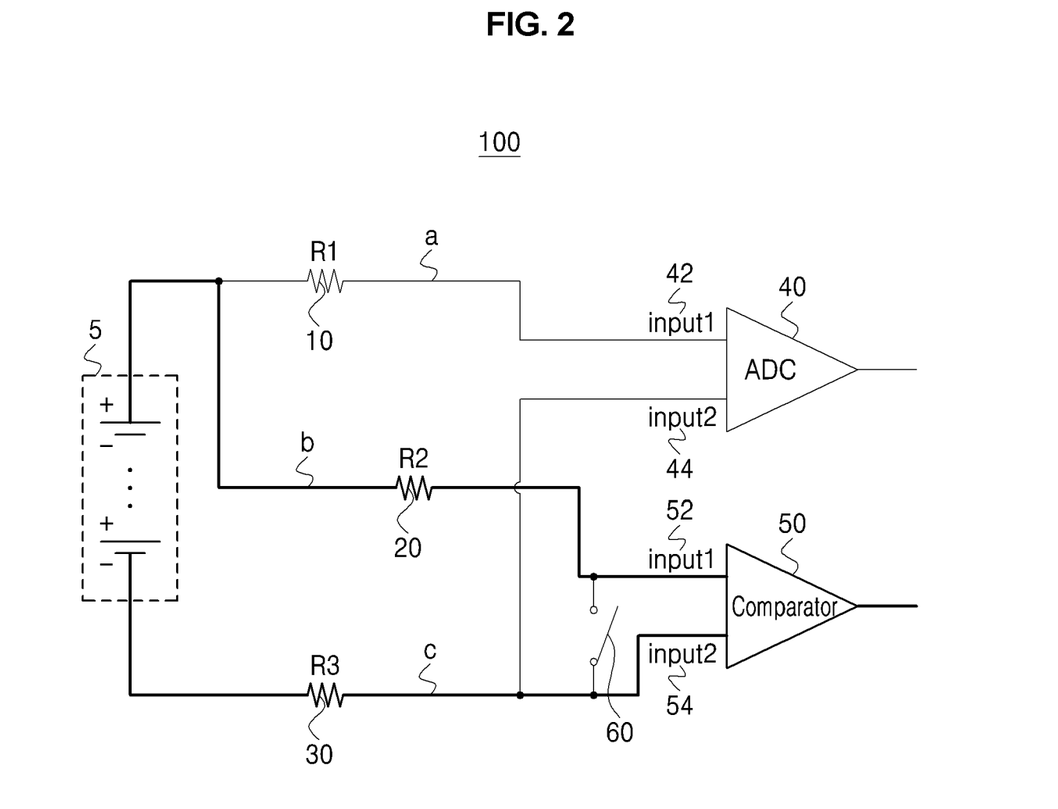
FIG. 2 illustrates an operation of a circuit for determining whether a first resistor has a fault.

FIG. 2 illustrates an operation of the fault diagnosis circuit 100 for determining whether the first resistor 10 has a fault.

Referring to FIG. 2, when the first resistor 10 has a fault, a current does not flow into the first line "a" or a too much current flows into the first line "a." Accordingly, whether the first resistor 10 has a fault may be diagnosed through the comparator 50 in a circuit in which the second line "b" and the third line "c" are connected.

More specifically, the fault diagnosis unit (not shown) may determine whether the first resistor 10 has a fault by comparing a voltage value, applied through the first input unit and second input unit of the comparator 50, with a reference voltage.

In this case, the fault diagnosis unit (not shown) may differently set the reference voltage of the comparator 50 depending on an operation of the switch 60.

When the switch 60 is turned off, the fault diagnosis unit (not shown) may set the reference voltage of the comparator 50 as a first reference voltage. In this case, the first reference voltage may be an output value calculated by inputting an output value of the ADC 40 to a DAC.

When the switch 60 is turned on, the fault diagnosis unit (not shown) may set the reference voltage of the comparator 50 as a second reference voltage.

In this case, the second reference voltage may be set smaller than the first reference voltage by taking into consideration the drop of a current flowing into the switch 60. For example, the second reference voltage may be a value obtained by subtracting the product of a value of the third resistor 30 of the third line "c" and a current Ib flowing into the third line "c" via the second line "b" and the switch 60 from the first reference voltage.

Figure 3:
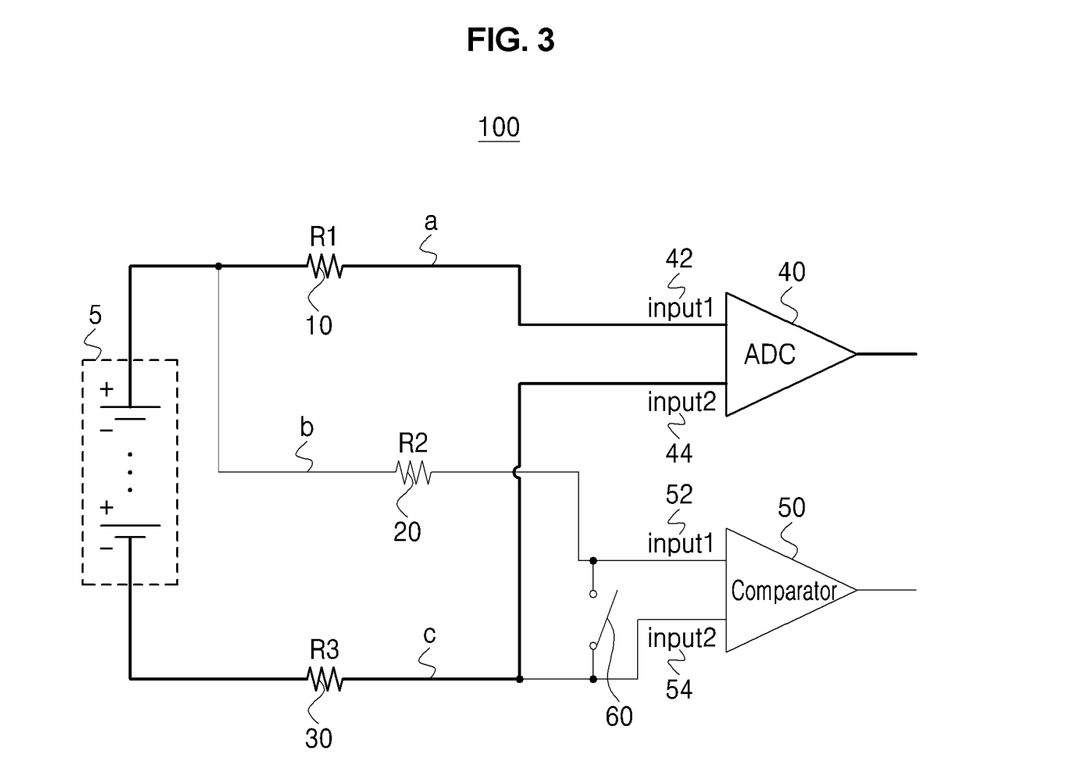
FIG. 3 illustrates an operation of a circuit for determining whether a second resistor has a fault.

FIG. 3 illustrates an operation of a circuit for determining whether a second resistor 20 has a fault.

Referring to FIG. 3, when the second resistor 20 has a fault, a current does not flow into the second line "b" or a too much current may flow into the second line "b." Accordingly, whether the second resistor 20 has a fault may be diagnosed through the ADC 40 in a circuit in which the first line "a" and the third line "c" are connected.

More specifically, the fault diagnosis unit (not shown) may diagnose whether the second resistor 20 has a fault based on an output voltage from the ADC 40.

In this case, the output voltage from the ADC 40 may be a value obtained by comparing a voltage, measured through the first input unit and second input unit of the ADC 40, with a reference voltage of the ADC 40 and converting a resulting voltage into a digital value.

For example, when the second resistor 20 has a fault, a voltage measured through the first input unit and second input unit of the ADC 40 may be greater or smaller compared to a case where the second resistor 20 is normal.

That is, a voltage output to the output side of the ADC 40 is changed. At this time, the fault diagnosis unit (not shown) may diagnose whether the second resistor 20 has a fault by detecting a change in the output voltage of the ADC 40.

The fault diagnosis unit (not shown) may set the reference voltage of the ADC 40 differently from the reference voltage of the comparator 50. The independence of the ADC 40 and the comparator 50 can be guaranteed by differently setting the reference voltage of the ADC 40 and the reference voltage of the comparator 50.

Figure 4:
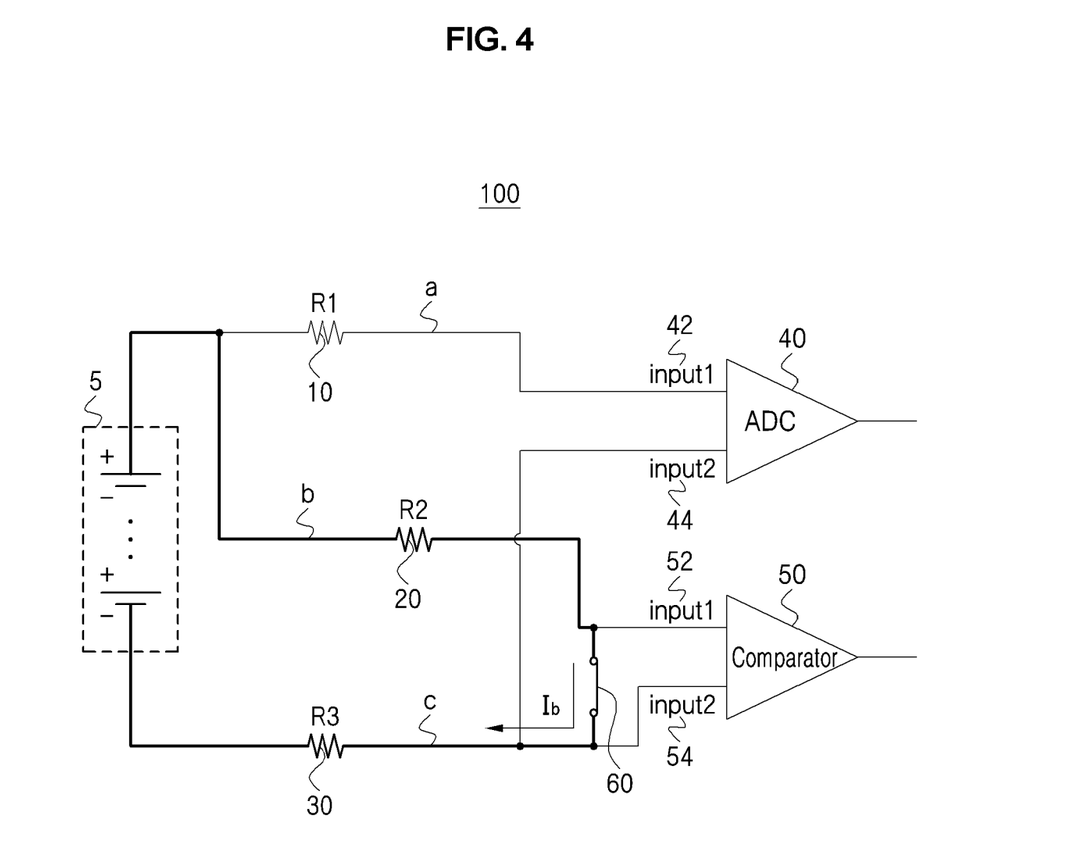
FIG. 4 illustrates an operation of a circuit for determining whether a third resistor has a fault.

FIG. 4 illustrates an operation of a circuit for determining whether the third resistor 30 has a fault.

Referring to FIG. 4, when the third resistor 30 has a fault, the ADC 40 and the comparator 50 may measure an erroneous voltage at the same time because a current does not flow into the third line "c."

More specifically, in order to diagnose whether the third resistor 30 has a fault, the fault diagnosis unit (not shown) drives the switch 60 to connect the second line "b" and the third line "c", and may diagnose a fault in the third resistor 30 by measuring a current in a corresponding circuit.

More specifically, the fault diagnosis unit (not shown) may diagnose whether the third resistor 30 has a fault through a current Ib flowing into the third resistor 30 in a circuit in which the second line "b" and the third line "c" are connected. For example, the fault diagnosis unit may include a current sensor. The current sensor may be a hall sensor.

The hall sensor is a device whose voltage varies depending on the intensity of a magnetic field, and measures a current using a hall effect. In this case, the hall effect means a phenomenon in which when a magnetic field is formed in a direction vertical to a current while the current flows into the conductor, a potential difference occurs in a direction vertical to a current within a conductor through which the current flows.

The fault diagnosis unit (not shown) according to an embodiment may notify a driver of a fault when the fault is diagnosed in the first resistor 10 and/or the third resistor 30. More specifically, when a fault is diagnosed in the BMS through the fault diagnosis circuit 100, the fault diagnosis unit (not shown) may notify a user of the fault so that the user visits a repair shot. For example, the fault diagnosis unit (not shown) may notify a user of a fault by displaying a warning message on a video device, such as the audio video navigation (AVN) of a vehicle, or generating an alarm sound through the audio device of a vehicle, but the present invention is not essentially limited thereto.

According to an embodiment, the fault diagnosis circuit 100 may diagnose whether a BMS has a fault and provide notification of the fault. Accordingly, the driving stability of an electric vehicle on which the BMS is mounted can be improved.

Figure 5:
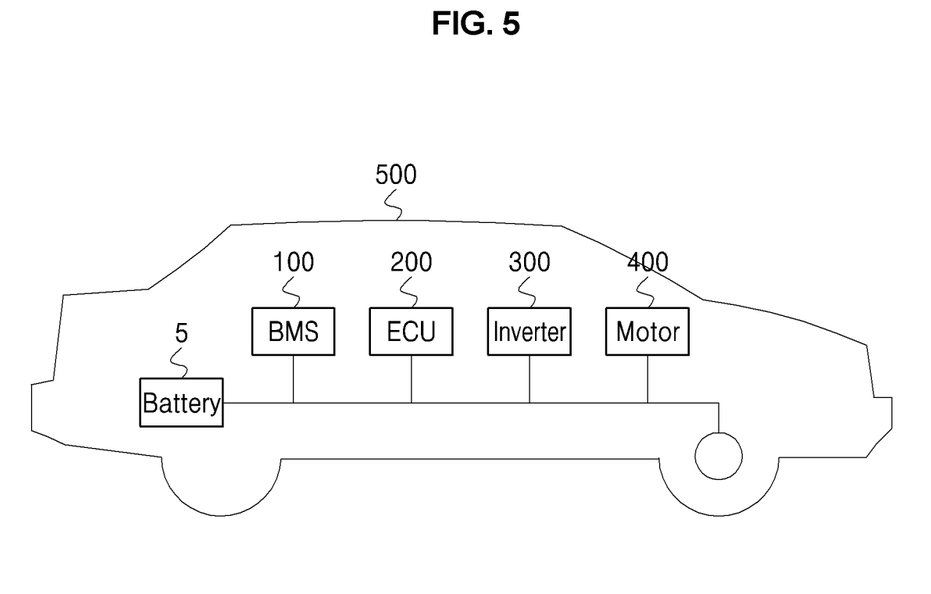
FIG. 5 illustrates a schematic configuration of an electric vehicle according to an embodiment of the present invention.

FIG. 5 illustrates a schematic configuration of an electric vehicle 500 according to an embodiment of the present invention.

Referring to FIG. 5, the electric vehicle 500 according to an embodiment includes a battery 5, a BMS 110, an electric control unit (ECU) 200, an inverter 300, and a motor 400. It is to be noted that the electric vehicle may include all additional elements necessary to drive the electric vehicle 500.

The battery 5 is an electric energy source for driving the electric vehicle 500 by providing driving power to the motor 400. The battery 5 may be charged or discharged by the inverter 300 depending on the driving of the motor 400.

The battery 5 may have a preset rated output voltage and capacity characteristic by connecting a plurality of battery cells in series or in parallel.

For example, the battery 5 may be configured with a lithium ion cell, a lithium polymer cell, a nickel cadmium cell, a nickel hydrogen cell, or a nickel zinc cell, but the present invention is not essentially limited thereto.

The BMS 110 is an abbreviation of a battery management system, and estimates the state of the battery 5 and manages the battery 5 using estimated state information. The BMS 110 controls the charging or discharging of the battery and may also estimate the replacement time of the battery 5.

Although not shown in FIG. 5, the fault diagnosis circuit 100 may be applied to the BMS 110, and thus the BMS may provide notification of whether it has a fault.

One or more ECUs 200 may be disposed in the electric vehicle 500.

The ECU 200 is an abbreviation of an electronic control unit for controlling the state of the electric vehicle 500. For example, the ECU 200 may determine torque information based on information, such as an accelerator, a brake, and speed, and may control the output of the motor 400 based on the torque information.

The ECU 200 may transmit a control signal to the inverter 300 so that the battery 5 is charged or discharged by the BMS 110.

The inverter 300 enables the battery 5 to be charged or discharged in response to a control signal from the ECU 200.

The inverter 300 converts power of the battery 5. The motor 400 may be driven by converted power of the inverter 300.

The motor 400 drives the electric vehicle 500 based on control information (torque information), received from the ECU 200, using electric energy of the battery 5.

When a driver starts the electric vehicle 500 including the above-described elements, the electric vehicle drives the motor 400 by transmitting a control signal to the ECU 200. The motor 400 is driven by electric energy of the battery 5, so the electric vehicle may start running.

While the electric vehicle 500 runs, it may identify the state of the battery 5 through the BMS 110, may diagnose whether the BMS 110 has a fault through the fault diagnosis circuit 100, and may notify the driver that the BMS 110 has a fault so that the driver visits a repair shot.

According to an embodiment, the fault diagnosis circuit 100 capable of efficiently diagnosing a fault in the battery management system 110 can be provided, and stable power can be supplied to the electric vehicle 500 through the battery management system 110. Accordingly, reliability in the running of the electric vehicle 500 can be improved by preventing the stop of running attributable to power of the battery 5 while the electric vehicle 500 runs.

The fault diagnosis circuit 100 according to an embodiment may be applied to various battery management systems in addition to the electric vehicle 500.

For example, the fault diagnosis circuit 100 may be applied to a BMS used in various energy storage systems using batteries in addition to a common internal combustion vehicle (ICV), an uninterruptible power supply system (UPS system), and a smart grid system, but the present invention is not essentially limited thereto.

The present invention has an effect in that a fault in a BMS can be efficiently diagnosed using a smaller number of elements.

Furthermore, the present invention has effects in that a production cost can be reduced and safety specifications of a BMS can be reinforced using a single ADC.

Effects which may be obtained in the present invention are not limited to the above-described effects, and other technical effects not described above may be evidently understood by a person having ordinary skill in the art to which the present invention pertains from the following description.

Although the embodiments of the present invention have been described with reference to the accompanying drawings, those skilled in the art to which the present invention pertains may understand that the present invention may be implemented in other detailed forms without changing the technical spirit or essential characteristics of the present invention. Accordingly, it is to be understood that the above-described embodiments are only illustrative, but are not limitative in all aspects.

What is claimed is:

1. A fault diagnosis circuit of a battery management system, comprising:
   a first line comprising a first resistor, having one end connected to a positive (+) terminal of a battery, and having the other end connected to a first input unit of an analog to digital converter (ADC);
   a second line comprising a second resistor, having one end connected to the positive (+) terminal of the battery, and having the other end connected to a first input unit of a comparator; and a third line comprising a third resistor, having one end connected to a negative (−) terminal of the battery, having a first other end connected to a second input unit of the ADC, and having a second other end connected to a second input unit of the comparator.

2. The fault diagnosis circuit of claim 1, further comprising a switch for diagnosing whether the third resistor has a fault,
wherein one end of the switch is connected to the other end of the second line, and
the other end of the switch is connected to the second other end of the third line.

3. The fault diagnosis circuit of claim 1, wherein:
whether the first resistor has a fault is diagnosed through the comparator, and
whether the second resistor has a fault is diagnosed through the ADC.

* * * * *

UNITED STATES PATENT AND TRADEMARK OFFICE
CERTIFICATE OF CORRECTION

PATENT NO. : 11,002,797 B2
APPLICATION NO. : 16/456497
DATED : May 11, 2021
INVENTOR(S) : Jae-Seung Park et al.

It is certified that error appears in the above-identified patent and that said Letters Patent is hereby corrected as shown below:

On the Title Page

Item [30], insert -- July 3, 2018 (KR) 10-2018-0077272 --

Signed and Sealed this
Twenty-first Day of December, 2021

Drew Hirshfeld
*Performing the Functions and Duties of the*
*Under Secretary of Commerce for Intellectual Property and*
*Director of the United States Patent and Trademark Office*